United States Patent
Morillon

(10) Patent No.: US 8,975,661 B2
(45) Date of Patent: Mar. 10, 2015

(54) ASYMMETRICAL BIDIRECTIONAL PROTECTION COMPONENT

(75) Inventor: Benjamin Morillon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/210,782

(22) Filed: Aug. 16, 2011

(65) Prior Publication Data

US 2012/0061803 A1 Mar. 15, 2012

(30) Foreign Application Priority Data

Aug. 18, 2010 (FR) .................................... 10 56648

(51) Int. Cl.
- H01L 29/66 (2006.01)
- H01L 29/861 (2006.01)
- H01L 29/06 (2006.01)
- H01L 29/32 (2006.01)

(52) U.S. Cl.
CPC ........ H01L 29/66098 (2013.01); H01L 29/861 (2013.01); H01L 29/0638 (2013.01); H01L 29/0649 (2013.01); H01L 29/32 (2013.01); Y10S 438/983 (2013.01)
USPC ........... 257/106; 257/173; 257/199; 257/481; 257/551; 257/603; 257/E29.327; 257/E29.335; 257/E21.355; 257/E21.356; 438/983

(58) Field of Classification Search
USPC ......... 257/106, 173, 199, 481, 551, 603, 361, 257/362, 497, E27.018, E29.327, E29.335, 257/E21.652, E21.355, E21.356; 438/983, 438/133, 309, 217, 289; 361/56
See application file for complete search history.

(56) References Cited

U.S. PATENT DOCUMENTS

| 4,824,797 | A | | 4/1989 | Goth |
|---|---|---|---|---|
| 5,441,900 | A | | 8/1995 | Bulucea et al. |
| 5,880,511 | A | * | 3/1999 | Yu et al. ........................ 257/497 |
| 6,015,999 | A | | 1/2000 | Yu et al. |
| 6,060,752 | A | * | 5/2000 | Williams ....................... 257/355 |
| 6,781,161 | B1 | | 8/2004 | Turner, Jr. et al. |
| 2007/0117336 | A1 | * | 5/2007 | Sumakeris et al. ........... 438/369 |
| 2010/0072573 | A1 | * | 3/2010 | Marreiro et al. .............. 257/534 |
| 2010/0237356 | A1 | * | 9/2010 | Haney et al. .................... 257/77 |

FOREIGN PATENT DOCUMENTS

CN 101180709 5/2008

OTHER PUBLICATIONS

French Search Report dated Nov. 17, 2010 from corresponding French Application No. 10/56648.

* cited by examiner

Primary Examiner — Benjamin Sandvik
Assistant Examiner — Leslie Pilar Cruz
(74) Attorney, Agent, or Firm — Allen, Dyer, Doppelt, Milbrath & Gilchrist, P.A.

(57) ABSTRACT

An asymmetrical bidirectional protection component formed in a semiconductor substrate of a first conductivity type, including: a first implanted area of the first conductivity type; a first epitaxial layer of the second conductivity type on the substrate and the first implanted area; a second epitaxial layer of the second conductivity type on the first epitaxial layer, the second layer having a doping level different from that of the first layer; a second area of the first conductivity type on the outer surface of the epitaxial layer, opposite to the first area; a first metallization covering the entire lower surface of the substrate; and a second metallization covering the second area.

25 Claims, 2 Drawing Sheets

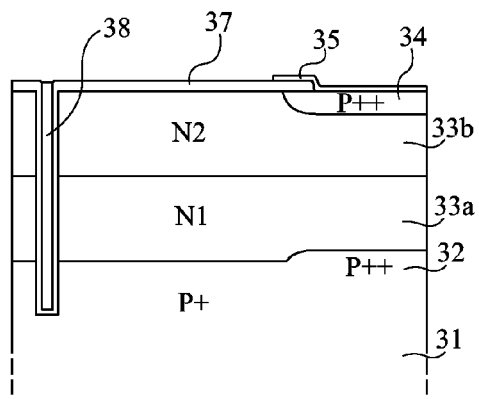 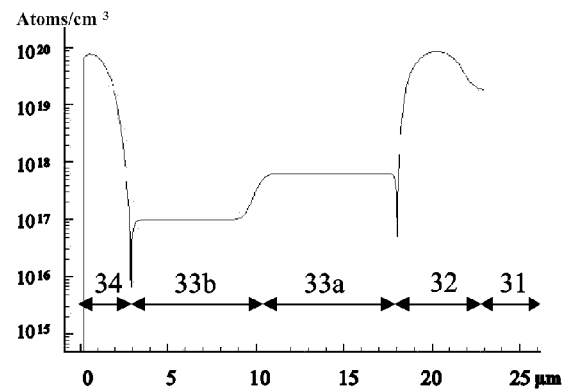
Fig 4A  Fig 4B
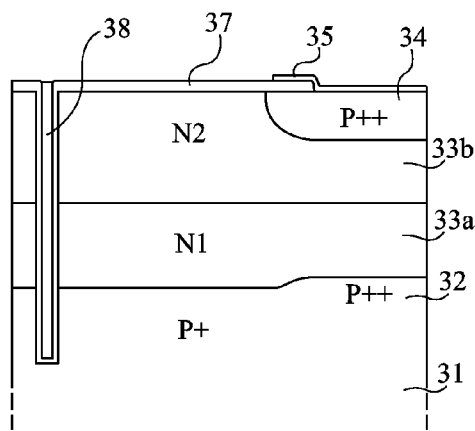 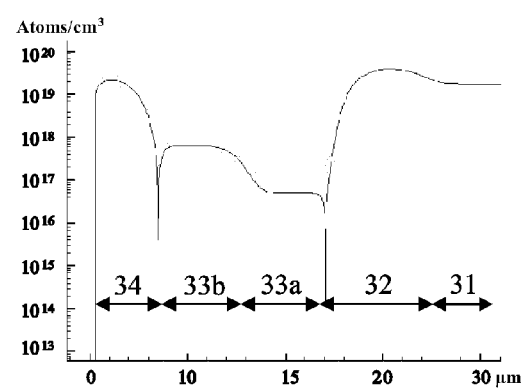
Fig 5A  Fig 5B
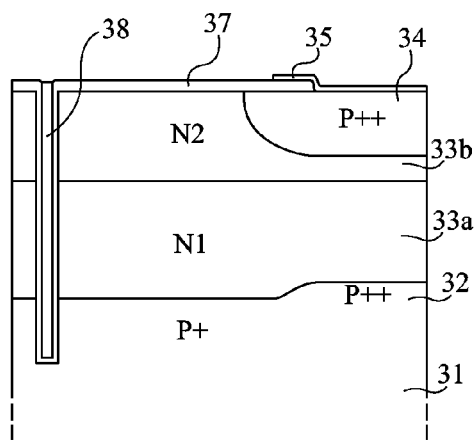 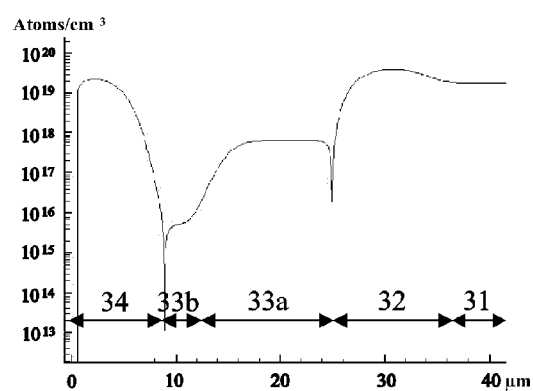
Fig 6A  Fig 6B

ASYMMETRICAL BIDIRECTIONAL PROTECTION COMPONENT

CROSS REFERENCE TO RELATED APPLICATIONS

This application claims the priority benefit of French patent application number 10/56648, filed on Aug. 18, 2010, entitled ASYMMETRICAL BIDIRECTIONAL PROTECTION COMPONENT, which is hereby incorporated by reference to the maximum extent allowable by law.

BACKGROUND OF THE INVENTION

1. Field of the Invention

The present invention relates to an asymmetrical vertical bidirectional component of protection against overvoltages. It more specifically relates to a protection component formed of three semiconductor layers of alternated conductivity types (only PNP structures will be mentioned hereafter to simplify the present description, but the invention also applies to NPN structures).

2. Discussion of the Related Art

Bidirectional protection components of the type having three semiconductor layers of alternated conductivity type are well known. In this type of component, the gain of the transistor formed by the PNP layers may be too low for this transistor to be able to trigger, that is, this component may behave only as two head to tail diodes in series.

Various structures have been provided to form a bidirectional protection diode with three semiconductor layers of alternated biasings.

FIG. 1 shows a first embodiment of a bidirectional protection component. This component is formed from an N-type semiconductor substrate 1.

On each side of the substrate are formed, generally by implantation/diffusion, opposite heavily-doped P-type areas 2 and 3, respectively in contact with metallizations 4 and 5. The upper and lower (or front surface and rear surface) peripheries of the component are coated with an insulating layer, typically silicon oxide, respectively 6 and 7.

The bidirectional protection component shown in FIG. 1 is very simplified. In practice, it will comprise various areas intended to improve its voltage and peripheral behavior, for example, heavily-doped N-type channel stop regions, on the upper side and on the lower side. Conventionally, during its manufacturing, this component forms an element of a semiconductor wafer which is then sawn as shown in FIG. 1.

The bidirectional protection component shown in FIG. 1 has a particularly high performance. According to the desired protection voltage, N-type substrate 1 will be more or less heavily doped and symmetrical protection voltages ranging from 6.8 to 220 volts can thus be obtained. Further, given that the component is formed from a relatively thick silicon substrate 1, for example, with a thickness ranging from 200 to 300 μm, the parasitic PNP transistor will have a particularly low gain and does not risk turning on, at the cost, however, of a non-negligible series resistance.

However, this component has a disadvantage in terms of assembly. Indeed, the lower surface of the component may not be able to be welded to a planar conductive base since any wicking could then risk short-circuiting metallization 5 and substrate 1. A base comprising a pedestal substantially having the surface of metallization 5 should be provided to avoid any weld overflow towards substrate 1. Such a configuration may be incompatible with the assembly of modern micropackages.

It has thus been tried to form bidirectional protection components capable of being assembled on planar conductive bases.

FIG. 2 shows an example of a structure adapted to such an assembly, currently called a well structure. The component of FIG. 2 is formed from a heavily-doped P-type silicon wafer 11 ($P^+$) on which an N-type layer 12, having a thickness ranging from 10 to 30 μm, is formed by epitaxy. A central area of layer 12 of a chip is covered with a heavily-doped P-type layer 13. The periphery of the epitaxial layer of a chip is surrounded with a P-type peripheral wall 14. P area 13 is coated with a metallization 16 and the lower surface of the substrate is coated with a metallization 17. An insulating layer 18, for example, made of silicon oxide, covers the upper periphery of the chip.

The structure of FIG. 2 effectively solves the problem of the welding of the chip on a planar conductive wafer. Indeed, even if there is a welding overflow, given that the entire periphery of the chip is of type P, no short-circuit risks to occur.

The structures of FIGS. 1 and 2 have substantially symmetrical breakdown voltages in the two biasings with which they are used, since the two useful junctions are formed from the same lightly-doped N layer. A light asymmetry (at most on the order of 8 V) can be caused by varying the doping profiles of the junction between the layer or the N-type substrate and the P-type regions.

Let us mention as a reference unpublished French patent application of the applicant filed under number 10/53680 of May 11, 2010, which aims at forming a perfectly symmetrical bidirectional protection component.

Thus, known bidirectional protection components typically are as symmetrical as possible. To obtain asymmetrical bidirectional protections, the series connection of two discrete diodes of opposite biasing would generally be used.

SUMMARY OF THE INVENTION

An embodiment provides an asymmetrical monolithic bidirectional protection component, that is, a component having two different breakdown voltages for the two biasings with which it is used.

It is further desired to provide such a component:

which provides a wide protection voltage range, and possibly very different protection voltages for the two biasings;

which can be assembled by welding in a micropackage, that is, on a planar conductive wafer; and/or for which the protection voltages can be accurately determined.

To achieve all or part of these and other objects, as well as others, at least one embodiment provides an asymmetrical bidirectional protection component formed in a semiconductor substrate of a first conductivity type, comprising a first implanted area of the first conductivity type; a first epitaxial layer of the second conductivity type on the substrate and the first implanted area; a second epitaxial layer of the second conductivity type on the first epitaxial layer, the second layer having a doping level different from that of the first layer; a second layer of the first conductivity type on the outer surface of the epitaxial layer, opposite to the first area; a first metallization covering the entire lower surface of the substrate; and a second metallization covering the second area.

According to an embodiment, outside of the first and second areas, an insulated trench crosses the first and second epitaxial layers.

According to an embodiment, the trench is formed through a heavily-doped ring of the second conductivity type, used as a channel stop.

According to an embodiment, at least one of the epitaxial layers is submitted to an operation of decrease of the lifetime of minority carriers, for example, by electronic or neutronic irradiation or implantation of heavy ions such as platinum or gold.

The foregoing and other objects, features, and advantages will be discussed in detail in the following non-limiting description of specific embodiments in connection with the accompanying drawings.

BRIEF DESCRIPTION OF THE DRAWINGS

FIGS. 4A, 5A, and 6A are detailed cross-section views of the upper left-hand portion of FIG. 3, for specific embodiments; and FIGS. 4B, 5B, and 6B are curves illustrating the dopings and the thicknesses of the different layers used in the structures of FIGS. 4A, 5A, and 6A, respectively.

As usual in the representation of integrated circuits, the various cross-section views of the components are not drawn to scale.

DETAILED DESCRIPTION

Figure 1:
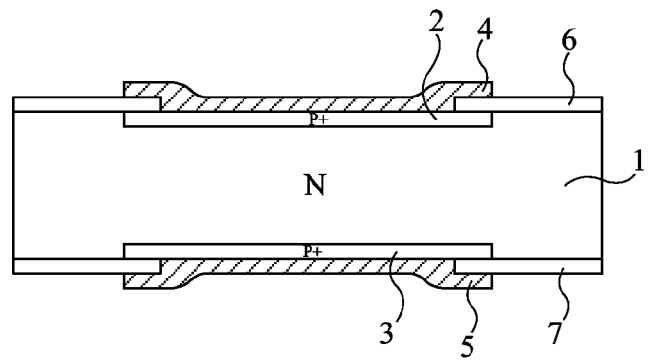
FIGS. 1 and 2 are simplified cross-section views of conventional bidirectional protection components.
Figure 2:
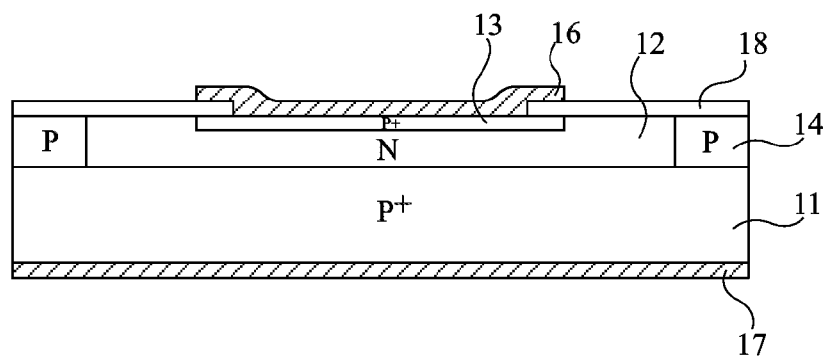
Figure 3:
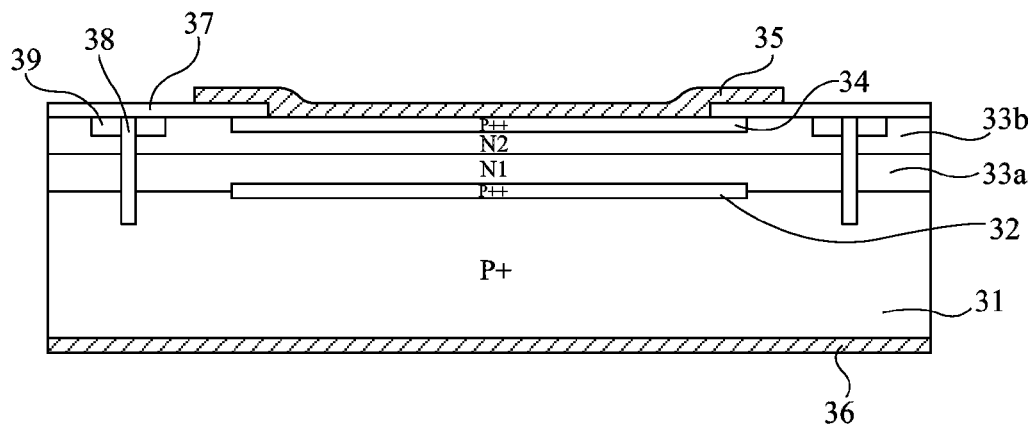
FIG. 3 is a simplified cross-section view of an asymmetrical monolithic bidirectional protection component according to an embodiment.

FIG. 3 is a simplified cross-section view of an asymmetrical monolithic bidirectional protection component. This bidirectional protection component is formed from a heavily-doped substrate 31 of the first conduction type, which will be considered hereafter, as an example, as being type P. A heavily-doped P-type area 32 is formed by implantation on the upper surface or front surface of the substrate, substantially at the center of the chip. A first N-type doped epitaxial layer 33a is formed on this structure. A second N-type epitaxial layer 33b of different doping level than layer 33a is formed on the front surface of layer 33a.

On the front surface of epitaxial layer 33b is formed by implantation a heavily-doped P-type area 34, opposite to area 32. N-type layers 33a and 33b respectively are less heavily-doped than P-type regions 32 and 34. Area 34 is covered with a metallization 35 and the entire rear surface of the substrate is covered with a metallization 36. Generally, an insulator 37 is deposited on the front surface prior to metallization 35 with an opening in front of area 32.

In the shown example, the lateral insulation of the structure comprises a peripheral trench 38 formed outside of areas 32, 34. This trench crosses layers 33a and 33b and penetrates into substrate 31, having at least its walls and its bottom covered with an insulator 37. Conventionally, the walls and the bottom are coated with silicon oxide and the trench is filled with polysilicon. For high protection voltages, greater than 100 V, for example, the trenches are preferably formed in a heavily-doped N-type peripheral ring 39 (channel stop ring).

Further, if necessary, the gain of the parasitic transistor may be decreased. For this purpose, an operation of decrease of the lifetime of minority carriers may be performed in the transistor base, for example, by electronic or neutronic irradiation or implantation of heavy ions such as platinum or gold.

Thus, the two breakdown voltages of the structure are respectively defined by the junction between P$^+$ area 32 and epitaxial layer 33a and by the junction between P$^+$ area 34 and epitaxial layer 33b. If the P$^+$ areas are sufficiently doped, these breakdown voltages will mainly depend on the respective doping levels of epitaxial layers 33a and 33b. The breakdown voltages (protection voltage of the structure) may thus be accurately and repetitively determined by selecting the doping levels of the epitaxial layers.

According to an advantage of the specific embodiment described in relation with FIG. 3, other parameters capable of having an influence on the values of these breakdown voltages may be done away with. In particular, P$^+$ areas 32 and 34 may result from identical implantations and have the same doping profile after anneal. Thus, the characteristics of areas 32 and 34 will have little influence on the breakdown voltages. Similarly, these P$^+$ areas have, in top view, the same geometric shape and will thus introduce no distortion specific to the desired breakdown voltage values. Finally, the peripheral trench is symmetrical, that is, it always is at the same distance from the limits of the P areas. It thus has no influence on the field line distribution and does not affect the selected breakdown voltage values.

Further, it should be noted that the described structure effectively enables to achieve several of the desired objects:

it is possible to obtain a wide range of protection voltages and protection voltages that may be very different by properly selecting the doping levels of the epitaxial layers;

the structure can be assembled by welding in a micropackage since its rear surface is formed of a single planar metallization; and as indicated, the protection voltages essentially depend on the selection of the dopings of the epitaxial layers; such doping choices may be obtained repetitively and will be little dependent on the manufacturing process.

In practice, a P-type doped substrate 31 at a concentration from $10^{18}$ to $2.10^{19}$ atoms/cm$^3$ may be used. The implantation of layer 32 may be performed to obtain a maximum concentration ranging from $3.10^{19}$ to $10^{20}$ atoms/cm$^3$ greater than that of the substrate. The doping of epitaxial layers 33a and 33b may vary from $10^{15}$ to $10^{18}$ atoms/cm$^{3b}$ according to the desired breakdown voltages. The thickness of these epitaxial layers, before diffusion of the P regions, approximately ranges from 10 to 50 µm. The implantation intended to form layer 34 may be performed to obtain the same doping profile as that of layer 32. After anneal, P$^+$ regions 32 and 34 extend from 2 to 10 µm deep into the epitaxial layer.

Each of FIGS. 4A, 5A, and 6A details the upper left-hand portion of the component of FIG. 3, in a specific embodiment, once the usual anneals have been performed. For each of these examples, the doping profile of the different layers according to the thickness is detailed, respectively, in FIGS. 4B, 5B, and 6B, the substrate being to the right, that is, towards large thicknesses.

Embodiment of FIGS. 4A and 4B

P substrate 31 is a silicon substrate doped at a concentration on the order of $2.10^{19}$ atoms/cm$^3$. Area 32 comprises a central doping peak at $10^{20}$ atoms/cm$^3$, 20 µm away from the front surface of the component and extends across a 5-µm thickness. Layer 33a of 8-µm thickness is uniformly doped at $6.10^{17}$ atoms/cm$^3$. Layer 33b of 7-µm thickness is uniformly doped at $10^{17}$ atoms/cm$^3$. Area 34 comprises a doping peak at $10^{20}$ atoms/cm$^3$, less than 1 µm away from the front surface, and extends across a 3-µm thickness.

The breakdown voltage of junction 32/33a then is 11 V, while the breakdown voltage of junction 34/33b is 20 V.

Embodiment of FIGS. 5A and 5B

P substrate 31 is a silicon substrate doped at a concentration on the order of $2.10^{19}$ atoms/cm$^3$. Area 32 comprises a doping peak, slightly offset towards the substrate, at $4.10^{19}$ atoms/cm$^3$, 20 µm away from the front surface of the component, and extends across a 6-µm thickness. Layer 33a of 4-µm thickness is uniformly doped at $5.10^{16}$ atoms/cm$^3$. Layer 33b of 4.5-µm thickness is uniformly doped at $6.10^{17}$ atoms/cm$^3$. Area 34 comprises a doping peak at $3.10^{19}$ atoms/cm$^3$, less than 1 µm away from the front surface, and extends across a 3.3-µm thickness.

The breakdown voltage of junction 32/33a then is 32 V, while the breakdown voltage of junction 34/33b is 16 V.

Embodiment of FIGS. 6A and 6B

P substrate 31 is a silicon substrate doped at a concentration on the order of $2.10^{19}$ atoms/cm$^3$. Area 32 comprises a doping peak, slightly offset towards the substrate, at $4.10^{19}$ atoms/cm$^3$, 30 µm away from the front surface of the component, and extends across a thickness of 12 µm. Layer 33a of 11.5-µm thickness is uniformly doped at $6.10^{17}$ atoms/cm$^3$. Layer 33b of 4.4-µm thickness is uniformly doped at $5.10^{15}$ atoms/cm$^3$. Area 34 comprises a doping peak at $3.10^{19}$ atoms/cm$^3$, less than 1 µm away from the front surface, and extends across a 8.8-µm thickness.

The breakdown voltage of junction 32/33a then is 15 V, while the breakdown voltage of junction 34/33b is 88 V.

Of course, the present invention is likely to have various alterations regarding the insulators used, the metallizations, the dimensions, and the doping levels, which will be selected by those skilled in the art according to the desired performances of the component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An asymmetrical bidirectional protection component formed in a semiconductor substrate of a first conductivity type, comprising:
    a first implanted area of the first conductivity type;
    a first epitaxial layer of a second conductivity type on the substrate and the first implanted area;
    a second epitaxial layer of the second conductivity type on the first epitaxial layer, the second epitaxial layer having a doping level different from that of the first epitaxial layer;
    a second implanted area of the first conductivity type on the outer surface of the second epitaxial layer, opposite to the first implanted area, wherein dopant concentrations of the first and second implanted areas are higher than dopant concentrations of the first and second epitaxial layers;
    a first metallization covering the entire lower surface of the substrate; and
    a second metallization covering the second implanted area.

2. The asymmetrical bidirectional component of claim 1, wherein, outside of the first and second implanted areas, an electrically insulated trench crosses the first and second epitaxial layers.

3. The asymmetrical bidirectional component of claim 2, wherein the trench is formed through a heavily-doped ring of the second conductivity type, used as a channel stop.

4. The asymmetrical bidirectional component of claim 2, wherein the electrically insulating trench is equidistant from an edge of the second implanted area.

5. The asymmetrical bidirectional component of claim 1, wherein at least one of the epitaxial layers is submitted to an operation of decrease of the lifetime of minority carriers by electronic or neutronic irradiation or implantation of heavy ions.

6. The asymmetrical bidirectional component of claim 1, wherein the first and second implanted areas have a same dopant profile.

7. The asymmetrical bidirectional component of claim 1, wherein the first and second implanted areas have a same geometry.

8. The asymmetrical bidirectional component of claim 1, wherein the first and second implanted areas have a same dopant profile and a same geometry.

9. The asymmetrical bidirectional component of claim 1, wherein the heavy ions comprise platinum or gold.

10. An asymmetrical bidirectional protection component comprising:
    a semiconductor substrate of a first conductivity type;
    a first implanted region of the first conductivity type within the semiconductor substrate;
    a first layer of a second conductivity type adjacent the substrate and the first implanted region;
    a second layer of the second conductivity type adjacent the first layer, the second layer having a doping level different from that of the first layer;
    a second implanted region of the first conductivity type at an outer surface of the second layer, wherein dopant concentrations of the first and second implanted regions are higher than dopant concentrations of the first and second layers; and
    an electrically insulating trench extending through the first and second layers from the outer surface of the second layer.

11. The protection component of claim 10, wherein the electrically insulating trench is located outside of the first and second implanted regions.

12. The protection component of claim 10, further comprising a channel stop formed as a heavily-doped ring of the second conductivity type in the outer surface of the second layer surrounding the protection component, wherein the electrically insulating trench is formed through the channel stop.

13. The protection component of claim 12, wherein the electrically insulating trench includes an insulating liner and a filling material.

14. The protection component of claim 12, wherein the electrically insulating trench is equidistant from an edge of the second implanted region.

15. The protection component of claim 10, further comprising:
    a first metallization contacting a first surface of the semiconductor substrate; and
    a second metallization contacting the second implanted region.

16. The protection component of claim 10, wherein a minority carrier lifetime has been decreased in at least one of the first and second layers by electronic or neutronic irradiation or heavy ion implantation.

17. The protection component of claim 10, wherein the first and second implanted regions have a same dopant profile.

18. The protection component of claim 10, wherein dopant concentrations of the first and second implanted regions are higher than dopant concentrations of the first and second layers by at least an order of magnitude.

19. The protection component of claim 18, wherein the dopant concentrations of the first and second implanted regions are between $3\times10^{19}$ atoms/cm$^{-3}$ and $10^{20}$ atoms/cm$^{-3}$.

20. The protection component of claim 10, wherein the first and second implanted regions have a same geometry.

21. The protection component of claim 10, wherein the first and second implanted regions have a same geometry and a same dopant profile.

22. A method of manufacturing an asymmetrical bidirectional protection component in a semiconductor substrate of a first conductivity type, comprising:
   implanting a dopant of the first conductivity type in a first area;
   forming by epitaxy a first layer of the second conductivity type on the substrate and the first implanted area;
   forming by epitaxy a second layer of the second conductivity type on the first layer, the second layer having a doping level different from that of the first layer;
   implanting a dopant of the first conductivity type in a second area on the outer surface of the second layer, opposite to the first area;
   doping the first area and the second area to a concentration that is higher than a concentration of the first layer and a concentration of the second layer;
   covering the entire lower surface of the substrate with a first metallization; and
   covering the second area with a second metallization.

23. The method of claim 22, wherein, outside of the first and second areas, an insulated trench is formed through the first and second layers.

24. The method of claim 23, wherein the trench is formed through a heavily-doped ring of the second conductivity type, used as a channel stop.

25. The method of claim 22, wherein at least one of the first and second layers is submitted to an operation of decrease of the lifetime of minority carriers, for example, by electronic or neutronic irradiation or implantation of heavy ions such as platinum or gold.

* * * * *